US011798606B2

(12) United States Patent
Dukovic et al.

(10) Patent No.: US 11,798,606 B2
(45) Date of Patent: Oct. 24, 2023

(54) ADDITIVE PATTERNING OF SEMICONDUCTOR FILM STACKS

(71) Applicant: Applied Materials, Inc., Santa Clara, CA (US)

(72) Inventors: John O. Dukovic, Palo Alto, CA (US); Srinivas D. Nemani, Sunnyvale, CA (US); Ellie Y. Yieh, San Jose, CA (US); Praburam Gopalraja, San Jose, CA (US); Steven Hiloong Welch, Milpitas, CA (US); Bhargav S. Citla, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 22 days.

(21) Appl. No.: 17/328,491

(22) Filed: May 24, 2021

(65) Prior Publication Data

US 2021/0305501 A1    Sep. 30, 2021

Related U.S. Application Data

(62) Division of application No. 16/525,470, filed on Jul. 29, 2019, now Pat. No. 11,049,537.

(51) Int. Cl.
*G11C 11/16* (2006.01)
*H10B 61/00* (2023.01)
(Continued)

(52) U.S. Cl.
CPC ............ *G11C 11/161* (2013.01); *H10B 61/00* (2023.02); *H10N 50/01* (2023.02); *H10N 50/10* (2023.02); *H10N 50/80* (2023.02); *H10N 50/85* (2023.02)

(58) Field of Classification Search
None
See application file for complete search history.

(56) References Cited

U.S. PATENT DOCUMENTS 7,885,105 B2    2/2011   Li et al.
8,546,263 B2    10/2013  Joubert et al.
(Continued)

FOREIGN PATENT DOCUMENTS

JP    2013-008870 A    1/2013
KR    10-2016-0021377 A    2/2016

OTHER PUBLICATIONS

International Search Report dated Sep. 28, 2020 for Application No. PCT/US2020/039093.

*Primary Examiner* — Daniel Whalen
(74) *Attorney, Agent, or Firm* — PATTERSON + SHERIDAN, LLP

(57) ABSTRACT

One or more embodiments described herein generally relate to patterning semiconductor film stacks. Unlike in conventional embodiments, the film stacks herein are patterned without the need of etching the magnetic tunnel junction (MTJ) stack. Instead, the film stack is etched before the MTJ stack is deposited such that the spin on carbon layer and the anti-reflective coating layer are completely removed and a trench is formed within the dielectric capping layer and the oxide layer. Thereafter, MTJ stacks are deposited on the buffer layer and on the dielectric capping layer. An oxide capping layer is deposited such that it covers the MTJ stacks. An oxide fill layer is deposited over the oxide capping layer and the film stack is polished by chemical mechanical polishing (CMP). The embodiments described herein advantageously result in no damage to the MTJ stacks since etching is not required.

6 Claims, 9 Drawing Sheets

(51) Int. Cl.
*H10N 50/01* (2023.01)
*H10N 50/10* (2023.01)
*H10N 50/80* (2023.01)
*H10N 50/85* (2023.01)

(56) References Cited

U.S. PATENT DOCUMENTS

| | | |
|---|---|---|
| 9,362,490 B1 | 6/2016 | Xiao |
| 10,255,935 B2 | 4/2019 | Xue et al. |
| 2005/0087785 A1* | 4/2005 | Lu .......................... G11C 11/16 |
| | | 257/E27.005 |
| 2009/0201722 A1 | 8/2009 | Giridhar et al. |
| 2013/0267042 A1 | 10/2013 | Satoh et al. |
| 2016/0351799 A1 | 12/2016 | Xue et al. |
| 2018/0108831 A1 | 4/2018 | Xue et al. |
| 2018/0205010 A1* | 7/2018 | Park ........................ H01L 43/12 |
| 2019/0165256 A1* | 5/2019 | Tien .................... H01L 23/5226 |
| 2020/0212030 A1* | 7/2020 | Chu ..................... H01L 27/224 |

* cited by examiner

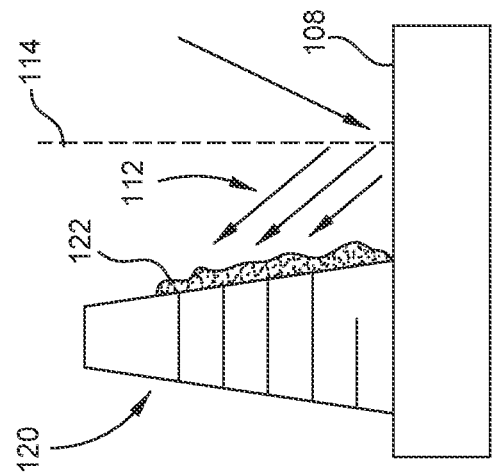
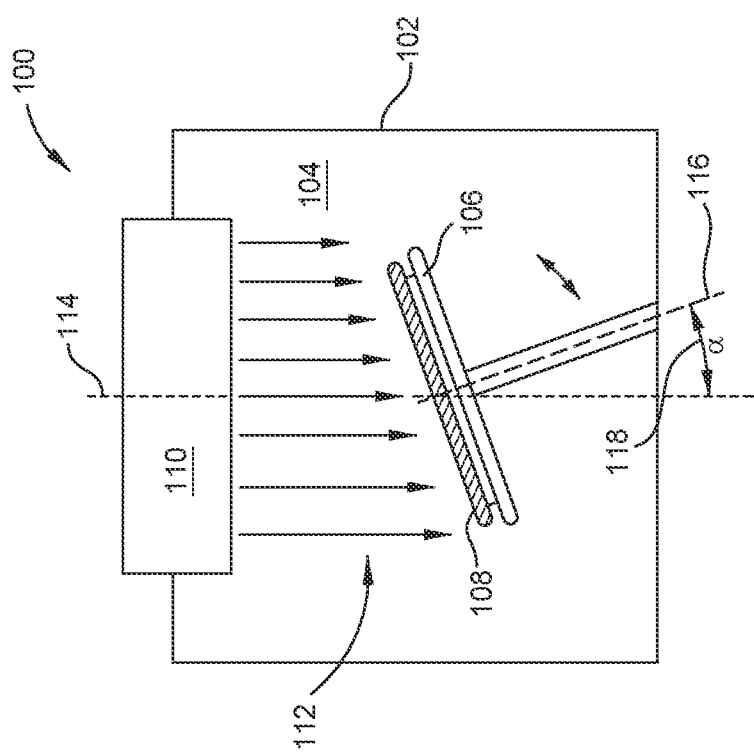

US 11,798,606 B2

ADDITIVE PATTERNING OF SEMICONDUCTOR FILM STACKS

CROSS-REFERENCE TO RELATED APPLICATIONS

This application is a divisional of co-pending U.S. patent application Ser. No. 16/525,470, filed Jul. 29, 2019, which is hereby incorporated herein by reference.

BACKGROUND

Field

One or more embodiments described herein generally relate to semiconductor fabrication, and more particularly, to patterning semiconductor film stacks.

Description of the Related Art

Microelectronic devices are generally fabricated on a semiconductor substrate as integrated circuits wherein various conductive layers are interconnected to one another to facilitate propagation of electronic signals within the device. An example of such a device is a storage element in magnetoresistive random access memories (MRAM) that facilitate storage of digital information in a form of the direction of magnetization of a magnetic material within the MRAM.

Generally, each MRAM cell includes a magnetic tunnel junction (MTJ) structure. The MTJ structure typically includes a stack of magnetic layers having a configuration in which two ferromagnetic layers are separated by a thin non-magnetic dielectric, e.g., an insulation tunneling layer. A top electrode and a bottom electrode are utilized to sandwich the MTJ structure so electric current may flow between the top and bottom electrode.

Fabrication of MRAM devices with MTJ stacks generally comprises different forms of etching, for example, ion beam etching (IBE). However, IBE has disadvantages and often causes problems. For example, IBE etching leaves post-etch residues on the MTJ stacks. The conductive residues or eroded layers may cause electrical short-circuits within an MRAM device, e.g., between the top and bottom magnetic layers, or may render the MRAM device to operate suboptimally or not at all. Additionally, because MTJ stacks are very thin, they are often damaged by the ions in IBE. Furthermore, as the pitch between neighboring MTJs continually shrinks for increasingly high density MRAM devices, IBE becomes increasingly difficult due to the slope of the MTJ stack sidewalls caused by tilting. Therefore, any change in the device thickness will affect the performance of the MTJ stack as the adjacent MTJs are insufficiently separated, which causes reduced device yield and increases the probability of device failure.

Accordingly, there is a need for methods for patterning MTJ stacks without the need for etching.

SUMMARY

One or more embodiments herein relate to methods for patterning film stacks.

In one embodiment, a method for patterning a film stack includes patterning a photoresist layer on a film stack, wherein the film stack comprises a buffer layer, an oxide layer, a dielectric capping layer, a spin on carbon layer, and an anti-reflective coating layer; etching the film stack such that the spin on carbon layer and the anti-reflective coating layer are completely removed and a trench is formed within the dielectric capping layer and the oxide layer; depositing magnetic tunnel junction (MTJ) stacks on the buffer layer and on the dielectric capping layer; depositing an oxide capping layer covering the MTJ stacks; depositing an oxide fill layer over the oxide capping layer; and chemical mechanical polishing the film stack.

In another embodiment, a method for patterning multiple film stacks includes providing a first film stack, patterning a photoresist layer on a first film stack, the first film stack comprising a buffer layer, an oxide layer, a dielectric capping layer, a spin on carbon layer, and an anti-reflective coating layer; etching the first film stack such that the spin on carbon on layer and the anti-reflective coating layer are completely removed and a trench is formed within the dielectric capping layer and the oxide layer; depositing magnetic tunnel junction (MTJ) stacks on the buffer layer and on the dielectric capping layer; depositing an oxide capping layer covering the MTJ stacks; depositing an oxide fill layer over the oxide capping layer; chemical mechanical polishing (CMP) the first film stack; and repeating the method to form at least one additional film stack over the first film stack.

One or more embodiments herein also relate to film stack devices.

In one embodiment, a film stack configuration includes a first film stack, comprising: a buffer layer; an oxide layer on a portion of the buffer layer; a magnetic tunnel junction (MTJ) stack on a portion of the buffer layer; an oxide capping layer, wherein the oxide capping layer covers the MTJ stack; and an oxide fill layer between portions of the oxide capping layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 1A is a schematic sectional view of a process chamber according to the prior art;

FIG. 1B is a schematic sectional view a MTJ film stack according to the prior art;

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 2:
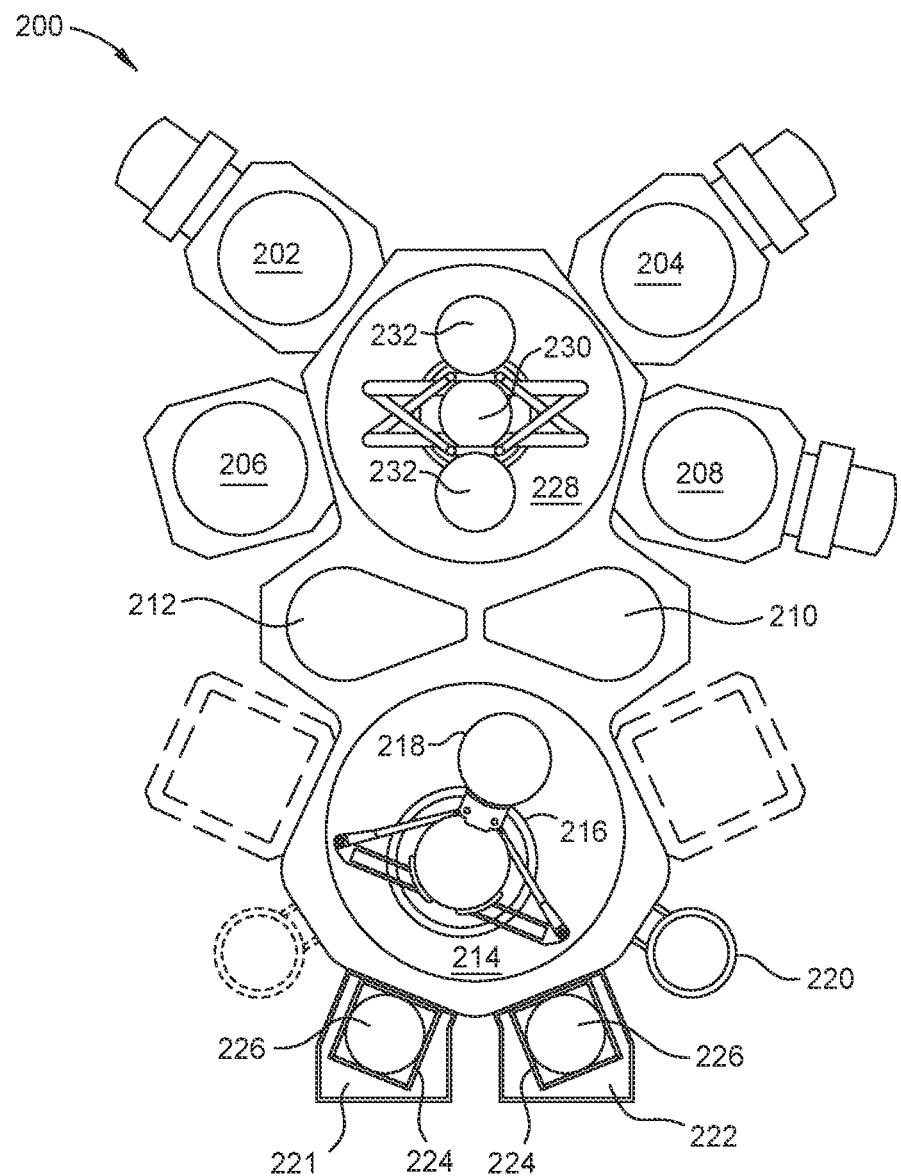
FIG. 2 is a schematic diagram of a cluster tool according to at least one embodiment described herein.

In the following description, numerous specific details are set forth to provide a more thorough understanding of the embodiments of the present disclosure. However, it will be apparent to one of skill in the art that one or more of the embodiments of the present disclosure may be practiced without one or more of these specific details. In other instances, well-known features have not been described in order to avoid obscuring one or more of the embodiments of the present disclosure.

One or more embodiments described herein generally relate to patterning semiconductor film stacks. In these embodiments, film stacks with magnetic tunnel junction (MTJ) stacks are provided. As discussed above, conventional approaches for fabrication of film stacks with MTJ stacks use etching processes, such as ion beam etching (IBE). However, IBE has limitations for fabricating film stacks with MTJ stacks, especially as the pitch between neighboring MTJ stacks continues to shrink. For example, IBE often causes sidewall re-deposition on the sidewalls of the MTJ stacks, often causes MTJ stack damage by ions, and the patterning is often difficult due to the sloped MTJ sidewalls in IBE processes.

In embodiments described herein, unlike in conventional embodiments, the film stacks with MTJ stacks are patterned without the need of etching the MTJ stack. Instead, a film stack including a buffer layer, an oxide layer, a dielectric capping layer, a spin on carbon layer, and an anti-reflective coating layer is provided with a photoresist layer patterning on top of the film stack. The film stack is etched before the MTJ stack is deposited such that the spin on carbon layer and the anti-reflective coating layer are completely removed and a trench is formed within the dielectric capping layer and the oxide layer. Thereafter, MTJ stacks are deposited on the buffer layer and the dielectric capping layer and an oxide capping layer is deposited such that it covers the MTJ stacks. An oxide fill layer is deposited over the oxide capping layer and the film stack is polished by chemical mechanical polishing. The embodiments described herein advantageously result in no damage to the MTJ stacks since etching occurs before the MTJ stacks are deposited. Additionally, no re-deposition forms on the sidewalls of the MTJ stacks and no sloping of the MTJ stacks is required, making patterning easier with more consistent results.

FIG. 1A is a schematic sectional view of a process chamber 100 according to the prior art and FIG. 1B is a schematic sectional view of a MTJ film stack 120 according to the prior art. FIG. 1A shows a conventional IBE process in the prior art. The process chamber 100 includes a chamber body 102 defining a process region 104. A substrate support 106 positions a substrate 108 in the process region 104. The process chamber 100 further includes an ion beam source 110. The ion beam source 110 directs a combed ion beam 112 toward the substrate 108 in the process region 104. The ion beam 112 may be combed along a central axis 114. The substrate support 106 positions the substrate 108 at a direction perpendicular to the substrate axis 116. The substrate axis 116 is at an angle 118 related to the central axis 114 of the ion beam 112 so that the ion beam 112 impinges the substrate 108 at the angle 118 to create angled trenches.

As shown in FIG. 1B, due to the combed ion beam 112 impinging the substrate 108 at the angle 118 (FIG. 1A), re-deposition forms on the sidewalls of the MTJ stack 120 in the form of residues 122. The residues 122 may cause electrical short-circuits within an MTJ stack 120, e.g., between the top and bottom magnetic layers, or may render the MTJ stack 120 to operate sub-optimally or not at all. Additionally, because the MTJ stack 120 is thin, the walls of the MTJ stack 120 are often damaged by the ion beam 112 in IBE processes. Furthermore, as the pitch between neighboring MTJ stacks continually shrinks for increasingly high density MRAM devices, IBE becomes increasingly difficult due to the slope of the walls of the MTJ stack 120 as shown in FIG. 1A. Therefore, any change in the device thickness will affect the performance of the MTJ stack 120 as the adjacent MTJ stacks are insufficiently separated, which causes reduced device yield and increases the probability of device failure. Embodiments described herein are designed to prevent these problems, as etching occurs before the MTJ stacks are deposited. As such, no ion beams strike the walls of the MTJ stacks, preventing damage to the MTJ stacks and preventing residues from forming on the walls of the MTJ stacks.

FIG. 2 is a schematic diagram of a cluster tool 200 according to at least one embodiment described herein. The cluster tool 200 is used to perform the method 600, described below. The cluster tool 200 includes, for example, four process chambers 202, 204, 206, and 208, a transfer chamber 228, a preclean chamber 212, a buffer chamber 214, a degas chamber 220, a cooldown chamber 210, and a pair of load lock chambers 221 and 222. Each process chamber 202, 204, 206, 208 represents a different stage or phase of semiconductor substrate processing. The buffer chamber 214 is centrally located with respect to the load lock chambers 221 and 222, the degas chamber 220, the preclean chamber 212, and the cooldown chamber 210. To effectuate substrate transfer among the chambers, the buffer chamber 214 contains a transfer mechanism 216. The substrates 226 are typically carried from storage to the system in cassettes 224 that are each placed in one of the load lock chambers 221 and 222. The transport mechanism 216 transports the substrates 226, one at a time, from one of the cassettes 224 to any of the degas chamber 220, the cooldown chamber 210, or the preclean chamber 212. Typically, a given substrate 226 is first placed in the degas chamber 220 and then moved to the preclean chamber 212. Individual substrates 226 are carried upon a substrate transport blade 218 that is located at the distal end of the transfer mechanism 216.

As shown in FIG. 2, the transfer chamber 228 is surrounded by the four process chambers 202, 204, 206, and 208, as well as the preclean chamber 212 and the cooldown chamber 210. To effectuate transport of a substrate 226 amongst the chambers, the transfer chamber 228 contains a transfer mechanism 230. The transfer mechanism 230 has a transfer support blade 232 attached at the distal end of the transfer mechanism 230 to carry individual substrates 226. In operation, the transfer mechanism retrieves a substrate 226 from the preclean chamber 212 and carries that substrate 226 to the first stage of processing, for example, a physical vapor deposition (PVD) stage within the process chamber 202. The PVD process is described in FIG. 3 below. Once the substrate 226 is processed and the PVD process deposits material upon the substrate 226, the substrate 226 can then be moved on to a second stage of processing, such as to a chemical vapor deposition (CVD) stage within the process chamber 204, for example. The CVD process is described in FIG. 4 below.

Once processing is complete within the process chambers, the transport mechanism 230 moves the substrate 226 from the process chambers and transports the substrate 226 to the cooldown chamber 210. The substrate 226 is then removed from the cooldown chamber 210 using the transport mechanism 216 within the buffer chamber 214. Lastly, the substrate 226 is placed in one of the transport cassettes 224 within one of the load lock chambers 221 or 222 where it can thereafter be removed and polished by a chemical mechanical polishing (CMP) process tool, which is described in FIG. 5 below.

Figure 3:
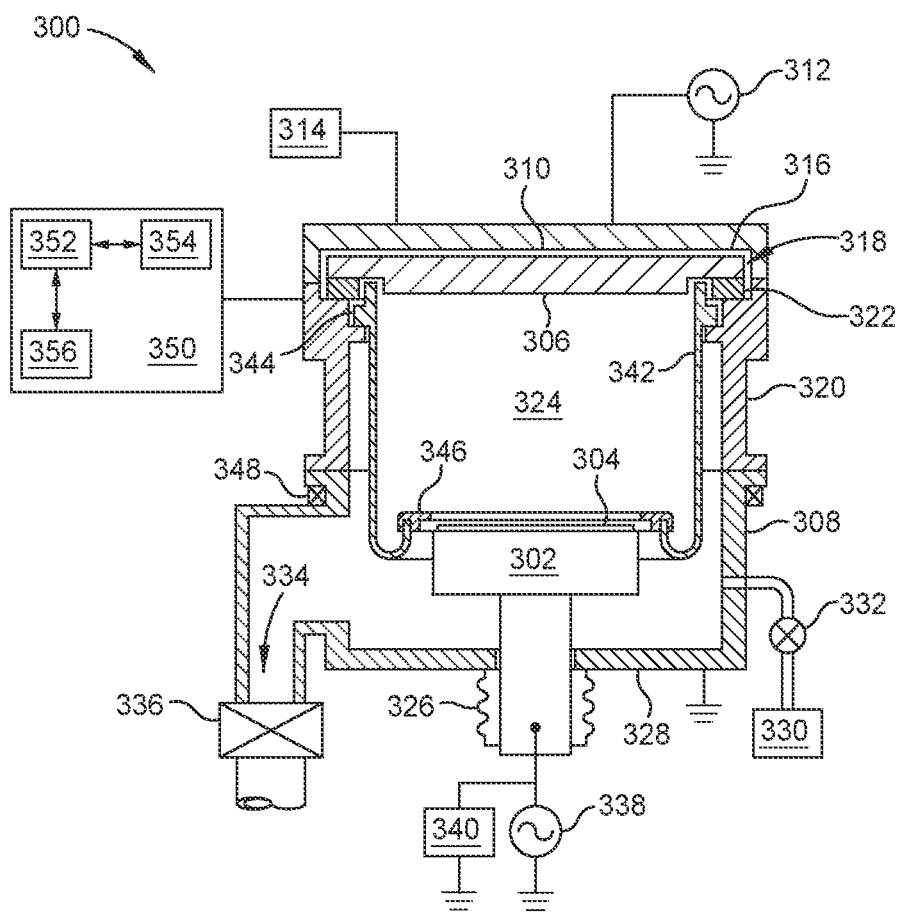
FIG. 3 is a schematic sectional view of a process chamber according to at least one embodiment described herein.

FIG. 3 is a schematic sectional view of the process chamber 300 according to at least one embodiment described herein. In these embodiments, the process chamber 300 is a PVD chamber, which can be the same as process chamber 202 described above in FIG. 2. The process chamber 300 generally includes a substrate support pedestal 302 for receiving a substrate 304 thereon, and a sputtering source, such as a target 306. The substrate support pedestal 302 may be located within a grounded enclosure wall (e.g., a chamber sidewall 308), which may be a chamber wall (as shown) or a grounded shield (a ground shield 316 is shown covering at least some portions of the process chamber 300 above the target 306). In some embodiments, the ground shield 316 could be extended below the target 306 to enclose the substrate support pedestal as well.

In some embodiments, the target 306 may be coupled to a source distribution plate 310. A direct current (DC) power source 314 and a radio frequency (RF) power source 312 may provide DC power and RF power, respectively, to the target 306 via the source distribution plate 310. In some embodiments, an insulative gap 318 is provided between the ground shield 316 and the outer surfaces of the source distribution plate 310 and the target 306 to prevent the RF and DC energy from being routed directly to ground. The insulative gap 318 may be filled with air or some other suitable dielectric material, such as a ceramic, a plastic, or the like. The target 306 may be supported on a grounded conductive aluminum adapter through a dielectric isolator 322. The target 306 comprises a material to be deposited on the substrate 304 during sputtering, such as a metal or metal oxide.

The substrate support pedestal 302 supports the substrate 304 in a process volume 324 of the process chamber 300. The process volume 324 is defined as the region above the substrate support pedestal 302 during processing (for example, between the target 306 and the substrate support pedestal 302 when in a processing position). In some embodiments, the substrate support pedestal 302 may be vertically movable through a bellows 326 connected to a bottom chamber wall 328 to allow the substrate 304 to be transferred onto the substrate support pedestal 302 through a load lock valve (not shown) in the lower portion of the process chamber 300 and thereafter raised to one or more positions for processing (e.g., as described above).

One or more processing gases are supplied from a gas source 330 through a mass flow controller 332 into the lower part of the process chamber 300. An exhaust port 334 may be provided and coupled to a pump (not shown) via a valve 336 for exhausting the interior of the process chamber 300 and maintaining a desired pressure inside the process chamber 300. In some embodiments, an RF power source 338 and a DC power source 340 are coupled to the substrate support pedestal 302 to induce a negative DC bias on the substrate 304. In addition, in some embodiments, a negative DC self-bias may form on the substrate 304 during processing. In some embodiments, the process chamber 300 further includes a process kit shield 342 connected to a ledge 344 of an adapter 320. The adapter 320 in turn is sealed and grounded to the chamber sidewall 308. Generally, the process kit shield 342 extends downwardly to below an upper surface of the substrate support pedestal 302 and returns upwardly until reaching an upper surface of the substrate support pedestal 302. A cover ring 346 rests on the top of the upwardly extending lip of the process kit shield 342.

In some embodiments, a magnet 348 is disposed about the process chamber 300 for selectively providing a magnetic field between the substrate support pedestal 302 and the target 306. The magnet 348 may be an electromagnet and may be coupled to a power source (not shown) for controlling the magnitude of the magnetic field generated by the electromagnet. A controller 350 may be provided and coupled to various components of the process chamber 300 to control the operation thereof. The controller 350 includes a central processing unit (CPU) 352, a memory 354, and support circuits 356. The controller 350 may control the process chamber 302 directly, or via computers associated with particular process chamber and/or support system components. The memory 354 of the controller 350 may be one or more of readily available memory such as random access memory (RAM), read only memory (ROM), floppy disk, hard disk, storage media, flash drive, or any other form of digital storage, local or remote. The support circuits 356 are coupled to the CPU 352 for supporting the processor in a conventional manner. The support circuits 356 include cache, power supplies, clock circuits, input/output circuitry, and subsystems, and the like.

Figure 4:
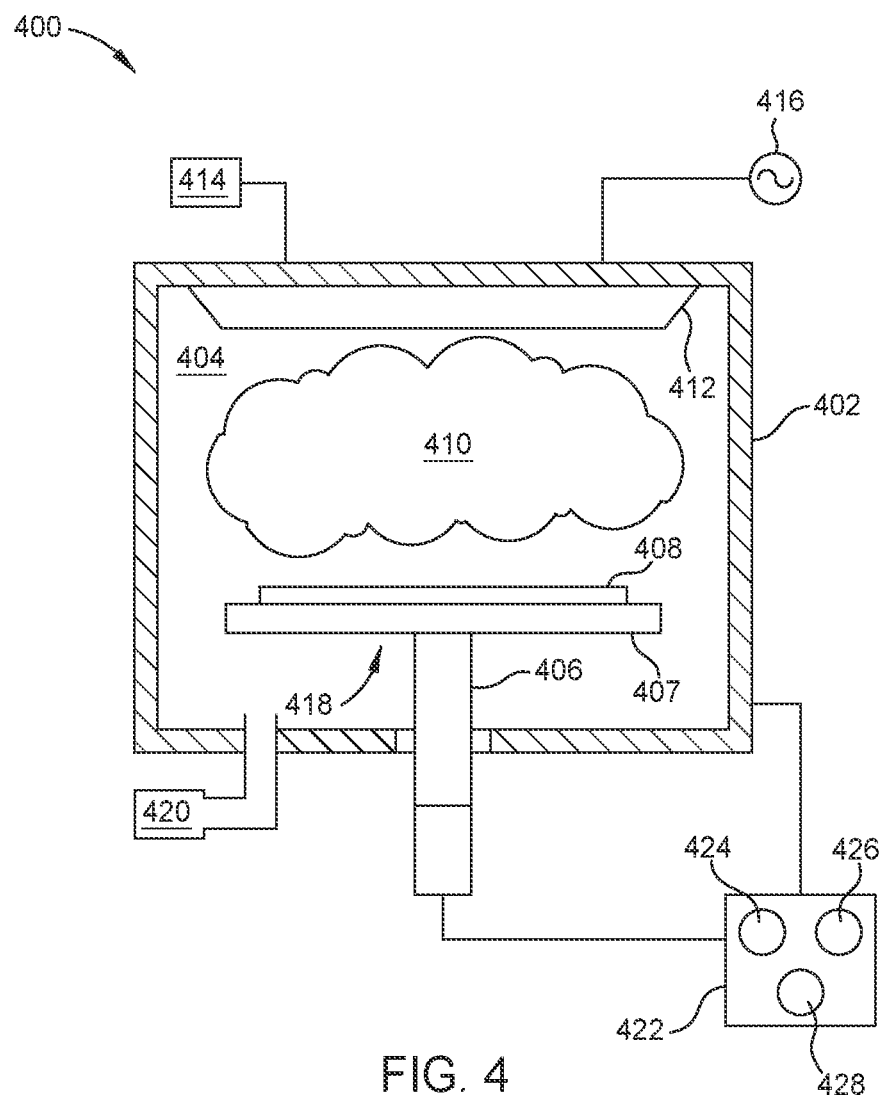
FIG. 4 is a schematic sectional view of a process chamber according to at least one embodiment described herein.

FIG. 4 is a schematic sectional view of a process chamber 400 according to at least one embodiment described herein. In these embodiments, the process chamber 400 is a CVD chamber, which can be the same as process chamber 204 described above in FIG. 2. The process chamber 400 includes a chamber body 402 which defines a process volume 404, a showerhead 412 disposed in the process volume 404, and a substrate support assembly 418 disposed in the process volume 404 facing the showerhead 412. The showerhead 412, having a plurality of openings (not shown) disposed therethrough, is used to distribute process gases, from a gas source 414 into the process volume 404. As shown in FIG. 4, the showerhead 412 is electrically coupled to a power source 416, such as an RF or another alternating current (AC) frequency power supply, which supplies power to ignite and maintain a plasma 410 of the process gases through capacitive coupling therewith. In other embodiments, the process chamber 400 comprises an inductive plasma generator and the plasma 410 is formed through inductively coupling an RF power to the process gases.

In these embodiments, the substrate support assembly 418 includes a movable support shaft 406 sealingly extending through a base wall of the chamber body 402, such as being surrounded by bellows (not shown) in the region below the chamber base, and a substrate support 407 disposed on the support shaft 406 and coupled thereto. The process volume 104 is fluidly coupled to a vacuum source 420, such as to one or more dedicated vacuum pumps, which maintains the process volume 404 at sub-atmospheric conditions and evacuates process gases and other gases therefrom. Typically, a lift pin system (not shown) facilitates transfer of a substrate 408 to and from the substrate support 407 by enabling access to the substrate 408 by a robot handler. The substrate 408 is transferred into and out of the process volume 404 through an opening (not shown) in a sidewall of the chamber body 402 which is sealed with a door or a valve (not shown) during processing.

The process chamber 400 further includes a controller 422 coupled to various components of the process chamber 400 to control the operation thereof. The controller 422 includes a central processing unit (CPU) 424, a memory 426, and support circuits 428. The controller 422 may control the process chamber 400 directly, or via computers associated with particular process chamber and/or support system components. The memory 426 of the controller 422 may be one or more of readily available memory such as random access memory (RAM), read only memory (ROM), floppy disk, hard disk, storage media, flash drive, or any other form of digital storage, local or remote. The support circuits 428 are coupled to the CPU 424 for supporting the processor in a conventional manner. The support circuits 428 include cache, power supplies, clock circuits, input/output circuitry, and subsystems, and the like.

Figure 5:
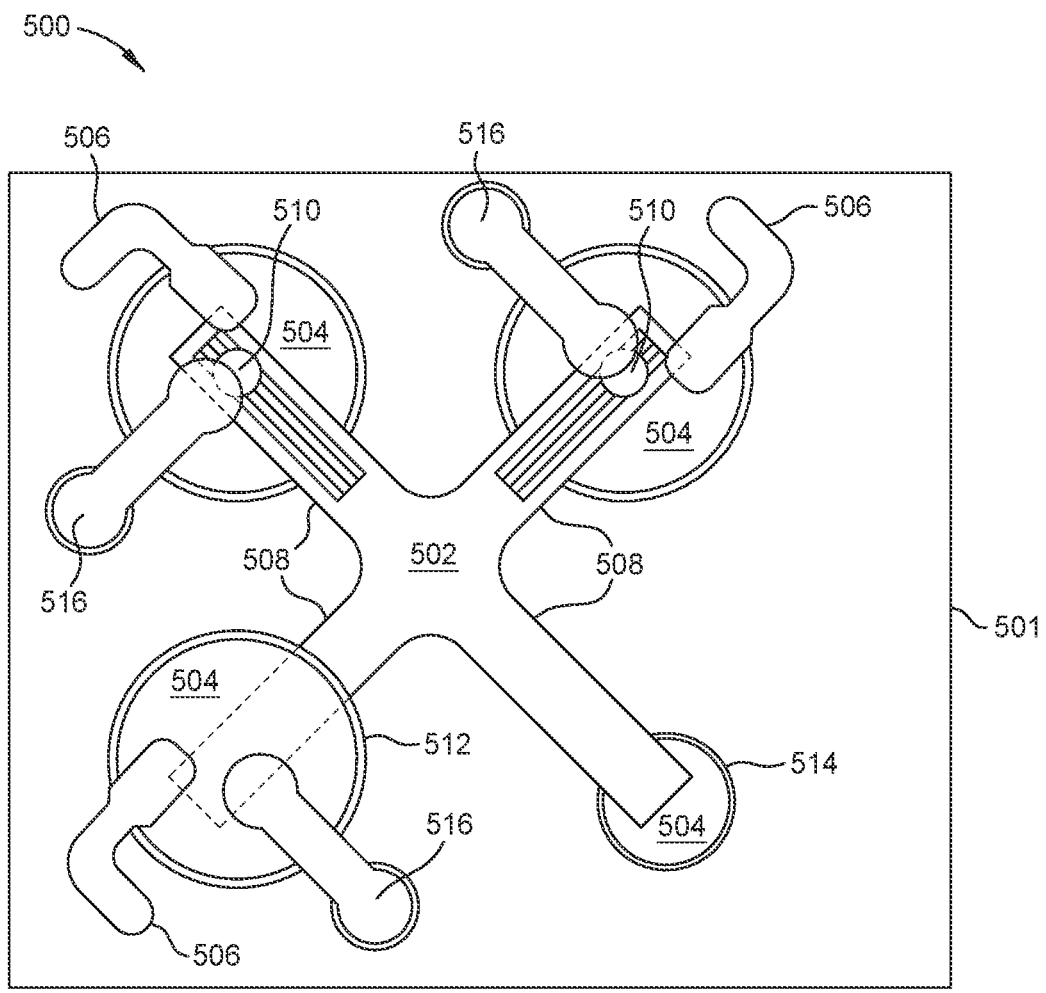
FIG. 5 is a schematic diagram of a CMP tool according to at least one embodiment described herein.

FIG. 5 is a schematic diagram of a CMP tool 500 according to at least one embodiment described herein. The CMP tool 500 includes a base 501. The base 501 includes a carriage 502 and a plurality of stations 504. The carriage 502 is centrally disposed on the base 501. In these embodiments, the carriage 502 includes a plurality of arms 508, each supporting a polishing head 510. The arms 508 extend from the carriage 502 cut over each station 504. The polishing heads 510 are generally supported above the stations 504. The stations 504 may be, for example, a transfer station 514 or a polishing station 512. The carriage is indexable such that the polishing head 510 may be moved between the polishing station 512 and the transfer station 514.

In these embodiments, conditioning devices 516 may be disposed on the base 501 adjacent to each of the polishing stations 512. The conditioning devices 516 may be used to periodically condition the polishing surface of the polishing stations 512 to maintain uniform polishing results. Each polishing station 512 has a fluid delivery arm 506. The fluid delivery arm 516 delivers a polishing fluid to the polishing surface of the polishing station 512 so that a substrate may be polished.

Figure 6:
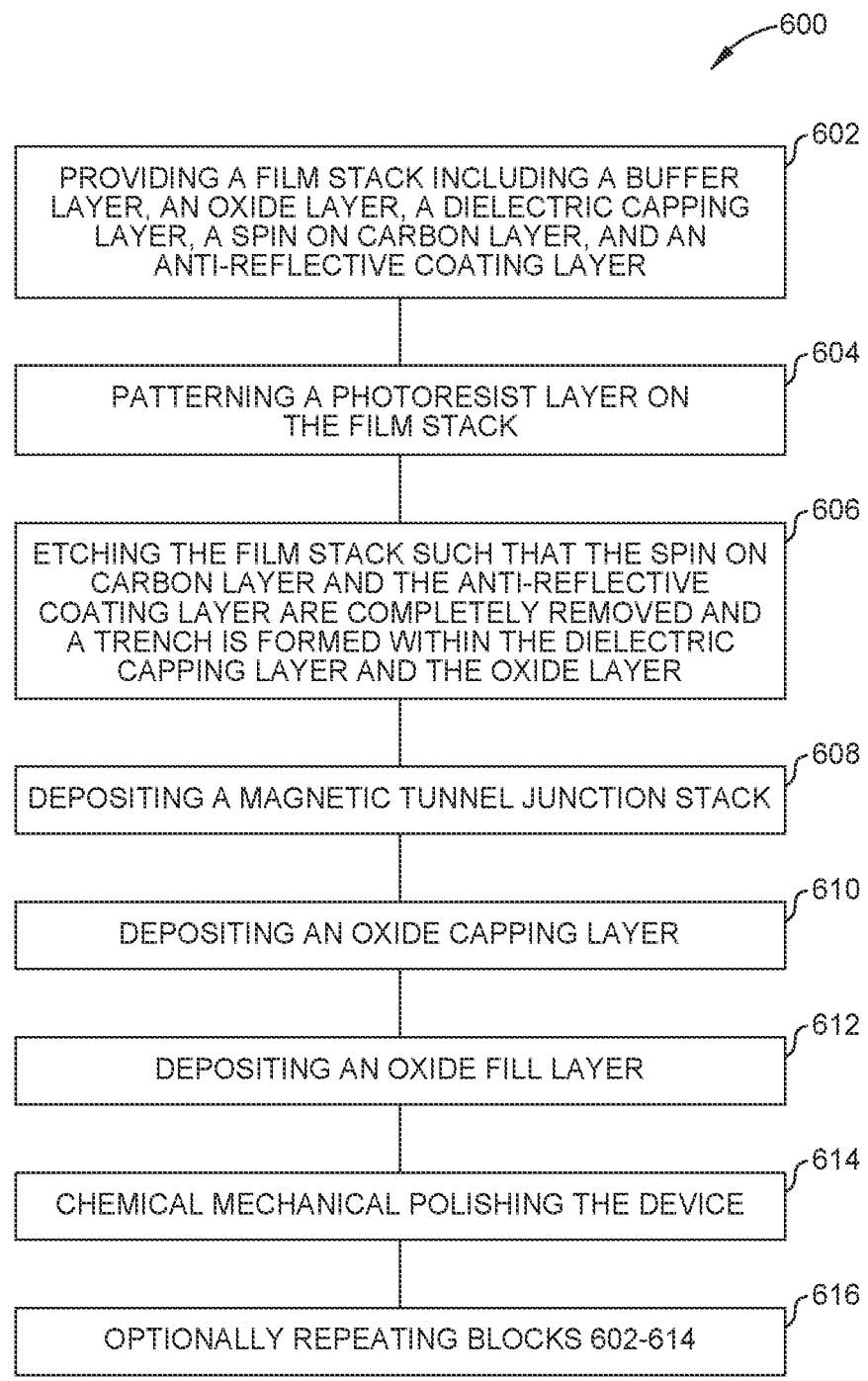
FIG. 6 is a flow chart of a method according to at least one embodiment described herein.

FIG. 6 is a flow chart of a method 600 according to at least one embodiment described herein. In these embodiments, the method 600 is performed with the systems and devices described in FIGS. 1-5, but is not limited to these systems and devices and can be performed with other systems and devices. FIGS. 7A-7F show a film stack 700 at each step of the method described in FIG. 6.

Figure 7A:
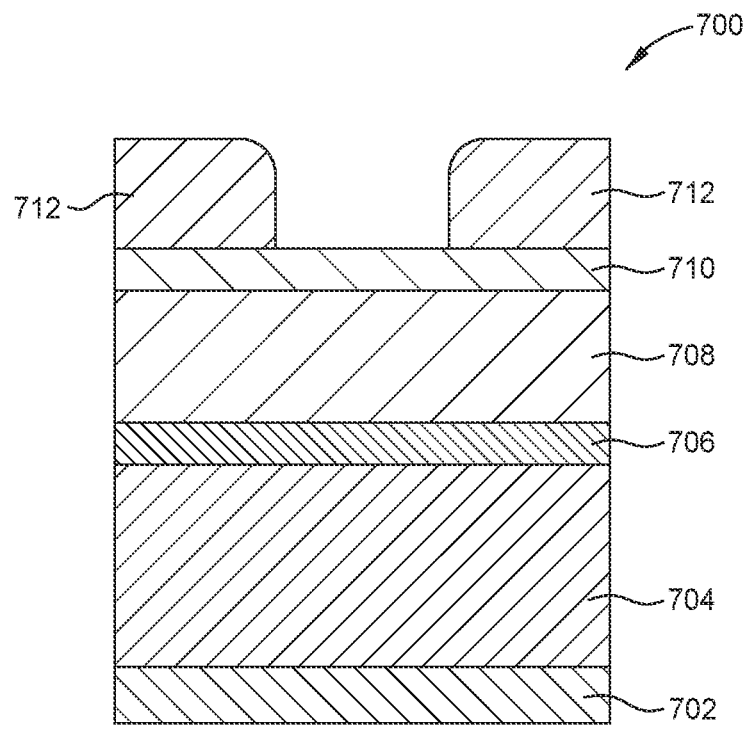
FIGS. 7A-7F show a film stack at each step of the method described in FIG. 6.

In block 602, the film stack 700 is provided that includes a buffer layer 702, an oxide layer 704, a dielectric capping layer 706, a spin on carbon layer 708, and an anti-reflective coating layer 710, as shown in FIG. 7A. In block 604, a photoresist layer 712 is patterned on top of the film stack 700. Specifically, the photoresist layer 712 is patterned on top of the anti-reflective coating layer 710, as shown in FIG. 7A.

Figure 7B:
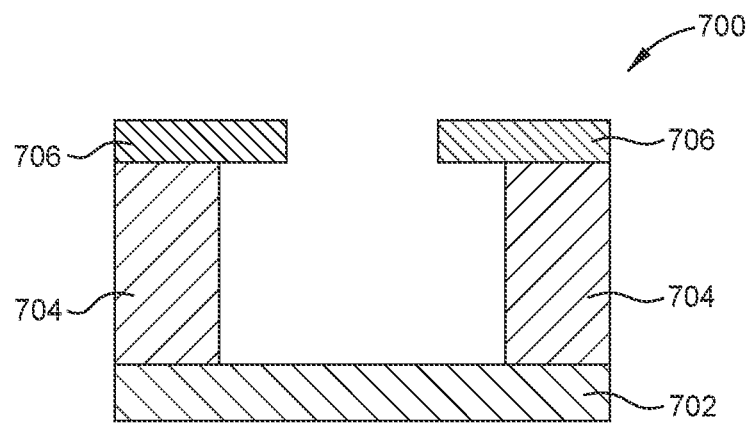

In block 606, the film stack 700 is etched such that the spin on carbon layer 708 and the anti-reflective coating layer 710 are completely removed and a trench is formed within the dielectric capping layer 706 and the oxide layer 704, as shown in FIG. 7B. The etch can be a wet or dry etch. In some embodiments, the etch can be a buffered oxide etch (BOE). The oxide layer 704 is narrower than the dielectric capping layer 706 such that sidewalls of the oxide layer 704 avoid exposure to sputtering that occurs in PVD processes. The etching process occurs in these embodiments without the MTJ stacks 714 (FIGS. 7C-7F), instead of with the MTJ stacks 714 present, advantageously resulting in neither damage to the MTJ stacks 714 nor any re-deposits of residues on the sidewalls of the MTJ stacks 714, as described in the prior art embodiment shown in FIGS. 1A-1B.

Figure 7C:
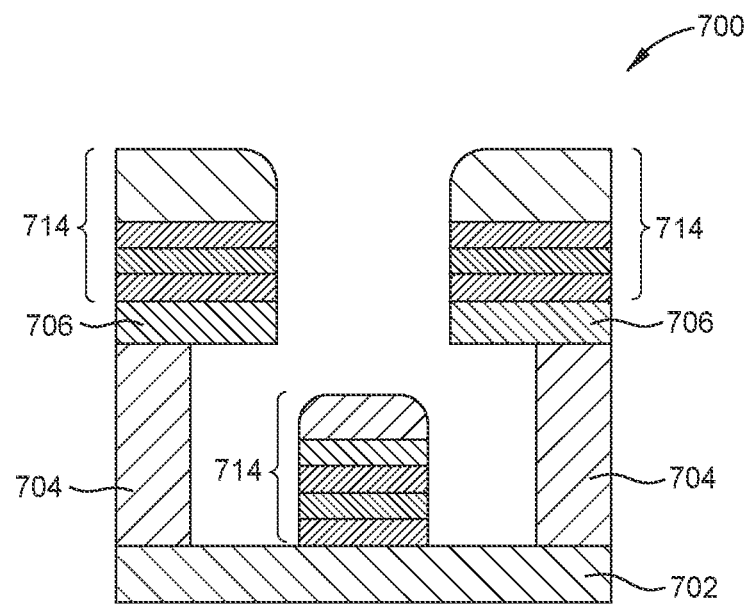
Figure 7D:
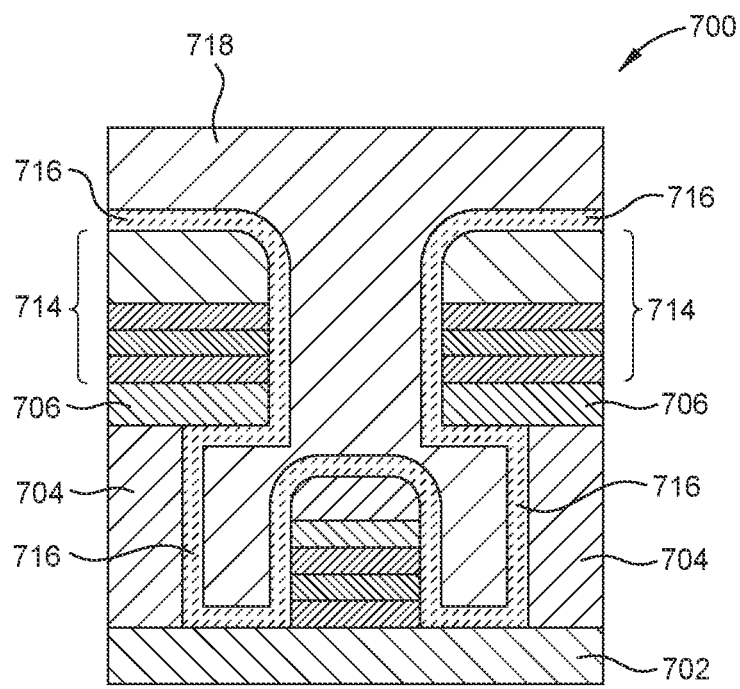

In block 608, MTJ stacks 714 are deposited on the buffer layer 702 and on the dielectric capping layer 706, as shown in FIG. 7C. The MTJ stacks 714 can include many layers, such as at least 30 layers. The MTJ stacks 714 are deposited in the process chamber 300 by PVD processes, as described above and shown in FIG. 3. In block 610, an oxide capping layer 716 is deposited that covers the MTJ stacks 714, as shown in FIG. 7D. The oxide capping layer 716 is also deposited by a PVD process. A separate tool (not shown) can be used to perform the PVD process for depositing the oxide capping layer 716. The separate tool can be added to the cluster tool 200 wherein the film stack 700 can be transferred in a vacuum. The oxide capping layer 716 can advantageously provide the MTJ stacks 714 sidewall protection and can protect the magnetic layers of the MTJ stacks 714 from oxidation.

Figure 7E:
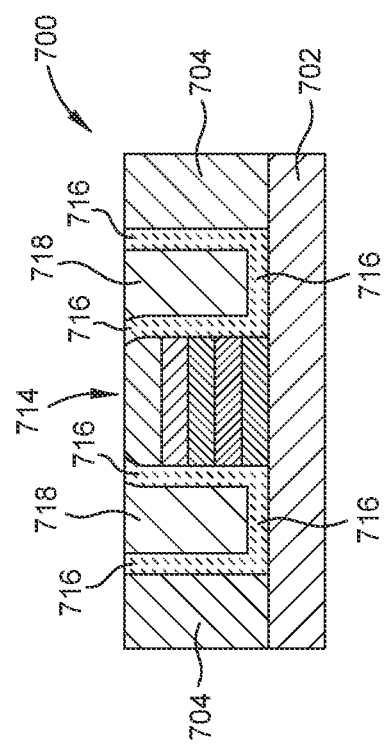

In block 612, an oxide fill layer 718 is deposited over the oxide capping layer 716, as shown in FIG. 7D. The oxide fill layer 718 is deposited in the process chamber 400 by CVD processes, as described above and shown in FIG. 4. In block 614, the film stack 700 is polished, as shown in FIG. 7E. The film stack is polished in the CMP tool 500 by a CMP process, as described above and shown in FIG. 5.

In these embodiments, the blocks 602-614 of the method 600 result in the film stack 700 including the buffer layer 702, the oxide layer 704, the MTJ stack 714, the oxide capping layer 716, and the oxide fill layer 718. The oxide layer 704 is on a portion of the buffer layer 702. The MTJ stack 714 is on a portion of the buffer layer 702. The oxide capping layer 716 covers the MTJ stack 714. The oxide fill layer 718 is between portions of the oxide capping layer 716. The top surface of the film stack 700 is substantially flat, which results from the CMP polishing provided in block 614.

Figure 7F:
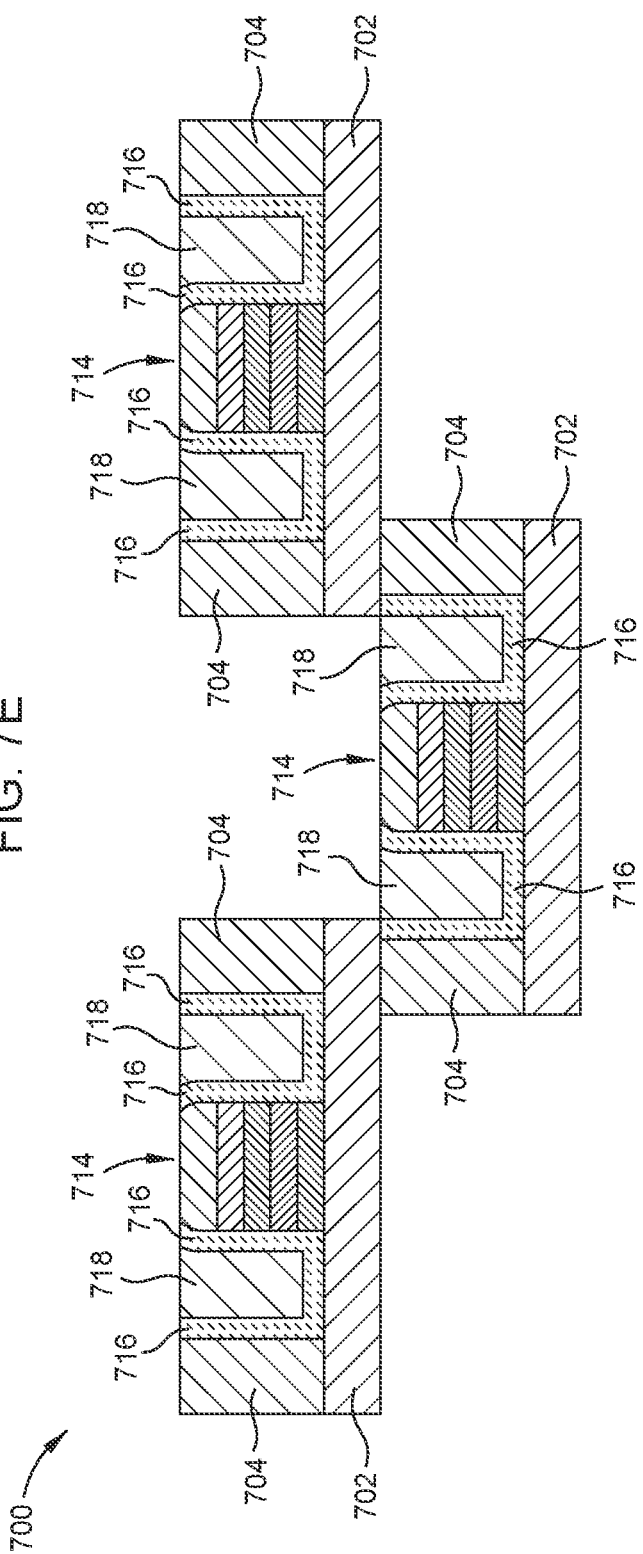

In optional block 616, blocks 602-614 of the method 600 can be repeated, resulting in multiple film stacks 700, as shown in FIG. 7F. Each of the film stacks 700 can be configured in staggered pattern such that the film stacks 700 stacked on top of one another. Each of the film stacks 700 can be electrically connected to one another.

Embodiments described herein advantageously prevent sidewall damage to the MTJ stacks 714 and re-deposition residues from forming on the sidewalls of the MTJ stacks 714 due the etching processes occurring before the MTJ stacks 714 are deposited. Additionally, no sloping of the MTJ stacks 714 is required, making patterning easier with more consistent results.

While the foregoing is directed to implementations of the present invention, other and further implementations of the invention may be devised without departing from the basic scope thereof, and the scope thereof is determined by the claims that follow.

We claim:

1. A film stack configuration, comprising:
a first film stack, comprising:
a buffer layer comprising a first portion, a second portion, and a third portion;
a magnetic tunnel junction (MTJ) stack on the first portion of the buffer layer, the MTJ stack having a top surface and a side surface;
an oxide capping layer on the second portion of the buffer layer,
wherein the oxide capping layer comprises a bottom portion and a side portion, wherein the oxide capping layer covers and is in direct contact with the side surface of the MTJ stack;

an oxide layer on the third portion of the buffer layer, wherein the oxide layer is in direct contact with the top surface of the third portion of the buffer layer, and wherein the oxide layer is in direct contact with the side portion of the oxide capping layer; and an oxide fill layer, disposed in a trench formed by the oxide capping layer, wherein the oxide fill layer is in direct contact with the bottom and side portion of the oxide capping layer.

2. The film stack configuration of claim 1, further comprising a plurality of additional film stacks.

3. The film stack configuration of claim 2, wherein the plurality of additional film stacks comprises two or more additional film stacks.

4. The film stack configuration of claim 3, wherein the first film stack and the two or more additional film stacks are arranged in a staggered configuration.

5. The film stack configuration of claim 4, wherein the first film stack and the two or more additional film stacks are electrically interconnected.

6. The film stack configuration of claim 1, wherein the MTJ stack comprises at least 30 layers.

* * * * *